United States Patent [19]
Huber et al.

[11] Patent Number: 4,996,504
[45] Date of Patent: Feb. 26, 1991

[54] MONOLITHICALLY INTEGRATABLE MICROWAVE ATTENUATION ELEMENT

[75] Inventors: Jakob Huber, Beyharting; Wolfgang Meier, Munich, both of Fed. Rep. of Germany

[73] Assignee: Siemens Aktiengesellschaft, Berlin and Munich, Fed. Rep. of Germany

[21] Appl. No.: 407,736

[22] Filed: Sep. 15, 1989

[30] Foreign Application Priority Data

Sep. 30, 1988 [EP] European Pat. Off. ........ 88116232.5

[51] Int. Cl.$^5$ ............................................ H03H 11/28
[52] U.S. Cl. .................................. 333/81 R; 307/568; 333/32
[58] Field of Search ...................... 333/103, 104, 81 R, 333/81 A, 262; 323/350, 351; 307/540, 580, 568, 571

[56] References Cited

U.S. PATENT DOCUMENTS

| 3,213,299 | 10/1965 | Rogers | 307/578 |
| 3,748,495 | 7/1973 | Messinger | 307/568 |
| 4,875,023 | 10/1989 | Maoz | 333/81 R |

FOREIGN PATENT DOCUMENTS

0148706 12/1984 European Pat. Off. .

OTHER PUBLICATIONS

"GaAs Monolithic Wideband (2–18 GHz) Variable Attenuators", by Y. Tajima et al, 1982 IEEE MTT-S International Microwave Symposium Digest, Dallas TX, Jun. 15–17, 1982, pp. 479–481.
"Performance of Dual-Gate GaAs MESFET's as Gain-Controlled Low-Noise Amplifiers & High-Speed Modulators", by C. A. Liechti, IEEE Transactions on Microwave Theory & Techniques, vol. MTT 23, No. 6, Jun. 1975, pp. 461–469.
"Microwave Switching With GaAs FETs", by Y. Ayasli, MICROWAVE JOURNAL, Nov. 1982, pp. 61–74.
"A Low Phase Shift Step Attenuator Using p–i–n Diodes Switches", by F. G. Ananasso, IEEE Transactions On Microwave Theory and Techniques, vol. MTT 28, No. 7, Jul. 1980, pp. 774–776.

*Primary Examiner*—Paul Gensler
*Attorney, Agent, or Firm*—Hill, Van Santen, Steadman & Simpson

[57] ABSTRACT

In a monolithically integratable microwave attenuation element, the attenuation is switchable between various, discrete values and the signal experiences only a small phase shift when switched between the individual attenuation values. The drain-source paths of field effect transistors (Q1, Q2, Q3) in the attenuation element are arranged in a PI configuration. Resistors (R11, R22, R33) are connected parallel to the drain-source paths of the field effect transistors (Q1, Q2, Q3) that are arranged in PI configuration.

17 Claims, 1 Drawing Sheet

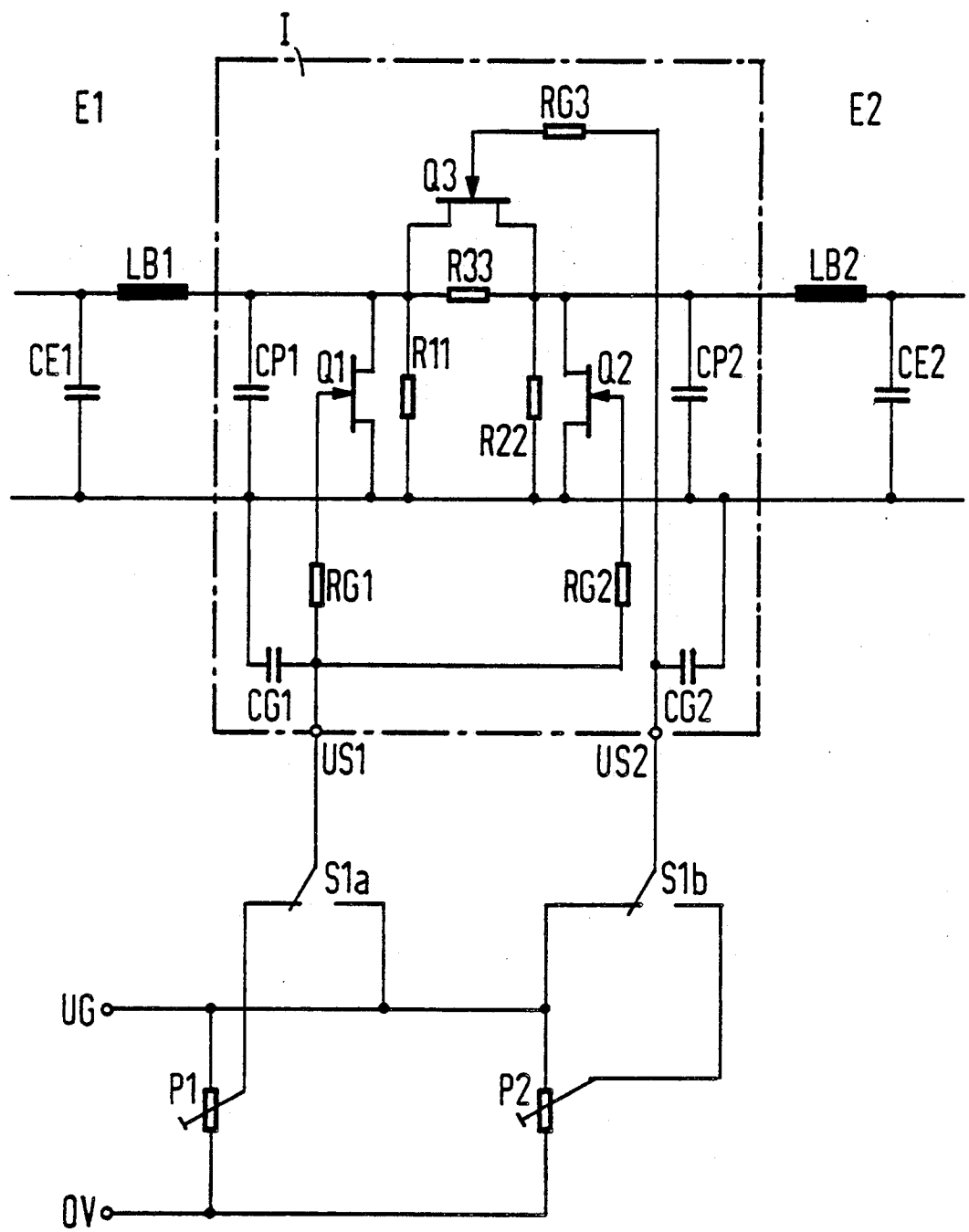

MONOLITHICALLY INTEGRATABLE MICROWAVE ATTENUATION ELEMENT

BACKGROUND OF THE INVENTION

The present invention is directed to a monolithically integratable microwave attenuation element which has field effect transistors arranged in a PI structure with terminal ports for a signal path and with control terminals.

Circuits that provide attenuations or gains which are switched between various, discrete values are required in many types of equipment using microwave technology. It is also frequently required of such circuits that a circuit signal experiences only an optimally small phase shift when switching between the individual attenuation or gain values (see, for example, IEEE Transactions on Microwave Theory and Techniques, volume MTT-23, column No. 6, June 1975, pages 461-469).

Also considered in the evaluation of such circuits are the structural size, the obtainable switching speed, the power consumption that is required for switching, the circuit outlay that is needed for driving the switch-over means, the high-frequency bandwidths in which the specified values are valid, the matching of the circuit in the various conditions and the precision with which the various attenuation or gain conditions can be set.

In the prior art, switchable microwave attenuation elements were composed either of bulky mechanical or electro-mechanical switchover devices or of electrically switchable PIN diode attenuation elements (see, for example, IEEE Transactions on Microwave Theory and Techniques, volume MTT-28, column No. 7, July 1980, pages 774-776) or of active elements (field effect transistors) wherein various attenuation or gain conditions could be set by the selection of defined operating points (see, for example, Microwave Journal, Nov. 1982, pages 61-74). Electro-mechanically adjustable attenuation elements are characterized by a large volume, very low switching speeds and high breaking capacities. Although switchable PIN diode attenuation elements usually have an extremely high switching speed, they require high breaking capacities, cannot be monolithically integrated in a simple manner and require relatively large space even in a hybrid structure. Both the mechanical and electro/mechanical attenuation elements as well as the known PIN diode attenuation elements are balanced by direct adjustment of the resistors that are effective in high-frequency terms. As a result the balancing of the elements is complicated.

The setting of defined gain or attenuation values on the basis of the selection of corresponding operating points in active elements can in fact occur relatively fast and with low power. However, a complex matching network is required at the input and at the output of such circuits, this considerably limiting the usable bandwidth and increasing the space requirement. Since the conversion of the control signal into the attenuation condition corresponding to this control signal occurs via the individual characteristic of the active element, a complex balancing is required in such designs. Moreover, changes in gain or attenuation in active elements usually involve a relatively great change of the signal phase.

Previously known circuits having field effect transistors in PI (see, for example, a company publication "Success in Microwaves", published by Plessey Research, (Caswell) limited, England) do not use any resistors connected parallel to the drain-source paths. In arrangements that produce the PI topology only with field effect transistors, the problem of a complicated successive balancing of the field effect transistor control voltages arises given the great unit-dependent tolerances of the channel resistances at a defined control voltage.

SUMMARY OF THE INVENTION

An object of the present invention is to provide a monolithically integratable microwave attenuation element of the type initially cited wherein the attenuation is switchable between various, discrete values and wherein the signal experiences only a slight phase shift when switching between the individual attenuation values.

The object is inventively achieved by a monolithically integratable microwave attenuation element that has field effect transistors (Q1, Q2, Q3) arranged in a PI structure, the PI structure having terminal ports for the signal path and having control terminals. The drain-source paths of the field effect transistors (Q1, Q2, Q3) are arranged in a PI configuration and a respective resistor (R11, R22, R33) is connected in parallel to each the drain-source paths of the field effect transistors (Q1, Q2, Q3) arranged in the PI configuration.

The microwave attenuation element of the present invention is switchable between at least two attenuation conditions. A microwave attenuation element of the present invention is advantageously executed as a monolithically integrated circuit. GaAs field effect transistors are preferably employed and thin-film or implantation resistors are advantageously used.

A microwave attenuation element of the present invention solves the above-identified problems in the prior art in a simple manner. As a consequence of the selected arrangement of the individual components, the phase shift between two attenuation conditions is very small. Typically, this phase shift amounts to a few degrees in the X-band. A monolithic integration enables an extremely small structural size. The obtainable switching speed is extremely high and the switching time can be limited to a maximum of ten nanoseconds. Only an extremely slight breaking capacity is required in a microwave attenuation element of the present invention. The drive can be provided by a simple level converter with the use of standard logic circuits.

As a consequence of the structure of the circuit and as a consequence of correspondingly selected switch element values, high bandwidths and good matching in at least two attenuation conditions are provided. Moreover, the circuit operates bidirectionally. Since only the series field effect transistor (Q3) acts as a controllable resistor in at least one attenuation condition and the parallel field effect transistors (Q1 and Q2) completely inhibit or because the parallel field effect transistors (Q1 and Q2) act as controllable resistors in at least one attenuation condition and the series field effect transistor (Q3) completely inhibits and because the resistors connected parallel to the inhibiting field effect transistors form the PI element together with the conductive field effect transistors and their parallel resistors, a matching to the desired attenuation value of the respective attenuation condition that is simple and independent of the attenuation conditions can be achieved via the dc control voltage of the active field effect transistors. Since the attenuation elements of the present invention are matched with respect to the characteristic impedance at the input and output, chains of attenuation elements having, for example, binarily graduated individual attenuations can be easily constructed with microwave attenuation elements of the present invention. Amplifiers having switchable gain can be constructed in a simple manner by the combination of an amplifier with a microwave attenuation element of the present invention.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing and in which:

The single figure is a circuit diagram of a microwave attenuation element of the present invention.

DESCRIPTION OF THE PREFERRED EMBODIMENT

The microwave attenuation element of the single figure is preferably fashioned as an integrated circuit I. The microwave attenuation element of the single figure is composed of field effect transistors, resistors and capacitors, and of two connecting parts for the signal path as well as two control voltage terminals. The drain-source paths of the field effect transistors Q1, Q2, Q3 are arranged in a PI configuration. Resistors R11, R22, R33 are connected parallel to the drain-source paths of the field effect transistors Q1, Q2, Q3, respectively. As a consequence of the desired precision, the resistor R33 is a thin-film resistor. As a consequence of the lower tolerance demands, the resistors R11, R22 are manufactured in a simple technology, for example as implantation resistors together with the channels of the field effect transistors.

Let the microwave attenuation element depicted in the single figure first be switchable only between two attenuation conditions. To enable an easy balancing of the attenuations in the two attenuation conditions, the parallel field effect transistors Q1, Q2 or the series field effect transistor Q3 are completely inhibited by a suitable control voltage. Only the control voltage of the field effect transistors that are conductive in the respective attenuation condition is used for the balancing of the attenuation.

The microwave attenuation element of the figure is composed of a PI arrangement of the resistors R11, R22, R33 and of the field effect transistors Q1, Q2, Q3. The field effect transistors, Q1, Q2, Q3 operate as controllable resistors in the start-up region (in the ohmic region) of the output characteristic, i.e. the resistances of the drain-source paths of the field effect transistors Q1, Q2, Q3 are varied via the control voltage terminals US1 and US2. The gate resistors RG1, RG2, RG3 together with the capacitors CG1, CG2 serve the purpose of decoupling the dc control signals from the radiofrequency signals at the source electrodes or drain electrodes of the field effect transistors, Q1, Q2, Q3. Together with the bond inductances LB1, LB2 and the external capacitors CE1, CE2, the chip-internal capacitors CP1, CP2 serve the purpose of matching to the characteristic impedance of the external system E1, E2.

The balancing of the circuit to the desired attenuation values can be simply achieved by the selected arrangement of the resistors R11, R22, R33 that are executed as thin-film resistors or, implantation resistors for monolithic integration of the microwave attenuation element.

For a high attenuation condition, a gate voltage US2 of such a magnitude is supplied to the series field effect transistor Q3 that its drain source path becomes a high-impedance. Only the resistor R33 connected parallel to the drain-source path of the field effect transistors Q3 is then effective in the longitudinal arm of the PI arrangement. The transistors Q1, Q2 can be set by balancing the variable resistor P1 such that the correct resistance combination for a reflection-free attenuation element having a defined attenuation results in the parallel circuit having the resistors R11 and R22.

In the condition of low attenuation, the drainsource paths of the parallel field effect transistors Q1, Q2 receive the gate voltage derived from a voltage level applied across terminals UV and OV, so that their drainsource paths are inhibited. The drain-source resistance of the field effect transistor Q3 can be set via the control voltage of the series field effect transistor Q3 by balancing the variable resistor P2, being set such that the correct resistance value of a PI circuit having the shunt resistors R11, R22 is achieved as a result of the parallel circuit with the resistor R33.

It is advantageous that the attenuation values in the two attenuation conditions can be set independently of one another due to the selected arrangement of resistors R11, R22, R33 parallel to the drain-source paths of the field effect transistors arranged in PI structure. Known arrangements of field effect transistors arranged in a PI structure do not have any parallel resistances and therefore require a difficult, successive balancing.

In monolithically integrated microwave circuits, there is a problem of producing a connection of this integrated circuit to the external circuit environment E1, E2 that is suited to the characteristic impedance. The bond wires frequently employed for this connection have an inductance that cannot be neglected in the frequency range of interest for the microwave attenuation element of the present invention, this inductance leading to mismatchings. The parallel connection of the capacitors CP1, CP2 to the input terminals of the microwave attenuation element I provides in a simple manner the connection of the attenuation element I to the circuit environment E1, E2 suited to the characteristic impedance.

The capacitors CP1, CP2 situated on the chip I, these capacitors being potentially executed as MIM (metal-insulator-metal) capacitors or as interdigital capacitors, form a PI-line simulation of the required characteristic impedance together with the bond inductances LB1, LB2 and small external capacitors CE1, CE2. As a result the bond connections normally present as parasitic elements can be advantageously utilized in the circuit. The capacitors CE1, CE2 can be realized in the form of broadened line portions of the striplines. When the capacitors CP1, CP2 are selected such that they are large in comparison to the parasitic capacitors of the normally small transistor systems Q1, Q2, a matching is achieved independently of the switch status of the field effect transistors.

The use of the bond inductances in a line simulation achieves a good matching over a frequency range of, typically, more than one octave in the microwave domain. The attenuations in this frequency range are nearly constant due to the mainly resistive functioning of the attenuation element and the phase shift of the signal remains small when the attenuation conditions are switched.

Capacitors CP2, CP2 are co-integrated in parallel with the signal ports, these respective capacitors forming a line simulation of concentrated elements together with the inductances LB1, LB2 of the leads to the chip I. Together with external capacitors CE1, CE2 they eliminate any disturbing influence of the lead inductance.

The capacitors of the line simulation are selected of such size that the influence of the capacitances of the field effect transistors and of other, parasitic capacitances is slight in comparison thereto and a matching in both attenuation conditions is thus achieved.

The influence of the capacitors CP1, CP2, which are connected in parallel to the signal ports of the circuit, that predominates over other capacitors is advantageously utilized to minimize the phase shift of the signal phase when shifting between the attenuation conditions.

The control voltage US1, US2 at the gates of the field effect transistors Q1 and Q2 or Q3 can advantageously have more than two values in the operating case. More than two attenuation conditions can be realized with a single microwave attenuation element in this manner.

The resistors R11, R22, R33 parallel to the drain-source paths of the field effect transistors Q1, Q2, Q3 serve the purpose of spreading the control characteristics in this case.

When the microwave attenuation element is a monolithically integrated circuit I, the attenuation element requires very little space.

Since only the small gate capacitors of the field effect transistors Q1, Q2, Q3 have to be charge-reversed when switching the attenuation conditions, a high switching speed can be achieved despite the high drop resistors. Moreover, only the power needed for recharging the gate capacitors at a defined frequency need be applied as the drive power. Since the field effect transistors Q1, Q2, Q3 are operated as controllable resistors, that is, quasi-passive components, the circuit can be bidirectionally operated.

The control voltages US1, US2 are supplied to the microwave attenuation element I via the switches S1a, S1b.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A monolithically integratable microwave attenuation element that has at least three field effect transistors (Q1, Q2, Q3) arranged in a PI structure, the PI structure having at least two terminal ports for a signal path and having control terminals, comprising drain-source paths of the field effect transistors (Q1, Q2, Q3) arranged in a PI configuration; a respective resistor (R11, R22, R33) connected parallel to each of the drain-source paths of the field effect transistors (Q1, Q2, Q3) arranged in the PI configuration; and a capacitor (CP1, CP2) connected in parallel with each of the terminal ports, the respective capacitor forming a line simulation of concentrated elements together with inductances (LB1, LB2) of leads connected to the terminal ports and together with external capacitors (CE1, CE2) connected to the terminal ports.

2. The microwave attenuation element according to claim 1, wherein one of the transistors is a series field effect transistor (Q3) in the PI configuration and wherein the resistor (R33) connected parallel to the drain-source path of the series field effect transistor (Q3) is fashioned as a thin-film resistor.

3. The microwave attenuation element according to claim 1, wherein two of the transistors are parallel field effect transistors (Q1, Q2) in the PI configuration and wherein the respective resistors (R11, R22) connected parallel to the drain-source paths of the parallel field effect transistors (Q1 Q2) are fashioned as implantation resistors.

4. The microwave attenuation element according to claim 1, wherein one of the transistors in the PI configuration is a series field effect transistor (Q3) and wherein the series field effect transistor (Q3) can be completely inhibited with a suitable control voltage.

5. The microwave attenuation element according to claim 1, wherein two of the transistors in the PI configuration are parallel field effect transistors (Q1, Q2) and wherein the parallel field effect transistors (Q1, Q2) can be completely inhibited with a suitable control voltage.

6. The microwave attenuation element according to claim 1, wherein the capacitances of the capacitors of the line simulation are of such size that the influence of the capacitances of the field effect transistors (Q1, Q2, Q3) and of other parasitic capacitors of the attenuation element is slight in comparison thereto.

7. The microwave attenuation element according to claim 1, wherein control voltages of the field effect transistors (Q1, Q2, Q3) have more than two values and are applied to the control terminals.

8. A monolithically integratable microwave attenuation element that has at least three field effect transistors (Q1, Q2, Q3) arranged in a PI structure, the PI structure having at least two terminal ports for a signal path and having control terminals, comprising: drain-source paths of the field effect transistors (Q1, Q2, Q3) arranged in a PI configuration; a respective resistor (R11, R22, R33) connected parallel to each of the drain-source paths of the field effect transistors (Q1, Q2, Q3) arranged in the PI configuration; one of the transistors in the PI configuration being a series field effect transistor (Q3), wherein the series field effect transistor (Q3) in the PI configuration can be completely inhibited with a suitable control voltage; two of the transistors in the PI configuration being parallel field effect transistors (Q1, Q2), wherein the parallel field effect transistors (Q1, Q2) in the PI configuration can be completely inhibited with a suitable control voltage; the control voltages of the field effect transistors (Q1, Q2, Q3) having more than two values and applied to the control terminals; and a capacitor (CP1, CP2) connected in parallel with each of the terminal ports, the respective capacitor forming a line simulation of concentrated elements together with inductances (LB1, LB2) of leads connected to the terminal ports and together with external capacitors (CE1, CE2) connected to the terminal ports.

9. The microwave attenuation element according to claim 8, wherein the resistor (R33) connected parallel to the drain-source path of the series field effect transistor (Q3) is fashioned as a thin-film resistor.

10. The microwave attenuation element according to claim 8, wherein the resistors (R11, R22) connected parallel to the drain-source paths of the parallel field effect transistors (Q1, Q2) are fashioned as implantation resistors.

11. The microwave attenuation element according to claim 8, wherein the capacitances of the capacitors of the line simulation are of such size that the influence of the capacitances of the field effect transistors (Q1, Q2, Q3) and of other parasitic capacitors of the attenuation element is slight in comparison thereto.

12. A monolithically integratable microwave attenuation element that has at least three field effect transistors (Q1, Q2, Q3) arranged in a PI structure, the PI structure having at least two terminal ports for a signal path and having control terminals, comprising: drain-source paths of the field effect transistors (Q1, Q2, Q3) arranged in a PI configuration; and a respective resistor (R11, R22, R33) connected parallel to each of the drain-source paths of the field effect transistors (Q1, Q2, Q3) arranged in the PI configuration; a capacitor (CP1, CP2) connected in parallel with each of the terminal ports, the respective capacitor forming a line simulation of concentrated elements together with inductances (LB1, LB2) of leads connected to the terminal ports and together with external capacitors (CE1, CE2) connected to the terminal ports; capacitances of the capacitors of the line simulation being of such size that the influence of the capacitances of the field effect transistors (Q1, Q2, Q3) and of other parasitic capacitors of the attenuation element is slight in comparison thereto.

13. The microwave attenuation element according to claim 12, wherein one of the transistors is a series field effect transistor (Q3) in the PI configuration and wherein the resistor (R33) connected parallel to the drain-source path of the series field effect transistor (Q3) is fashioned as a thin-film resistor.

14. The microwave attenuation element according to claim 12, wherein two of the transistors are parallel field effect transistors (Q1, Q2) in the PI configuration and wherein the resistors (R11, R22) connected parallel to the drain-source paths of the parallel field effect transistors (Q1, Q2) are fashioned as implantation resistors.

15. The microwave attenuation element according to claim 12, wherein one of the transistors in the PI configuration is a series field effect transistor (Q3), and wherein the series field effect transistor (Q3) can be completely inhibited with a suitable control voltage.

16. The microwave attenuation element according to claim 12, wherein two of the transistors in the PI configuration are parallel field effect transistors (Q1, Q2), and wherein the parallel field effect transistors (Q1, Q2) can be completely inhibited with a suitable control voltage.

17. The microwave attenuation element according to claim 12, wherein control voltages of the field effect transistors (Q1, Q2, Q3) can have more than two values and are applied to the control terminals.

* * * * *